United States Patent
Bog et al.

(10) Patent No.: US 11,855,037 B2
(45) Date of Patent: Dec. 26, 2023

(54) METHOD FOR PRODUCING AN ELECTRICALLY CONDUCTIVE CONNECTION ON A SUBSTRATE, MICROELECTRONIC DEVICE AND METHOD FOR THE PRODUCTION THEREOF

(71) Applicant: Karlsruher Institut für Technologie, Karlsruhe (DE)

(72) Inventors: Uwe Bog, Karlsruhe (DE); Michael Hirtz, Linkenheim-Hochstetten (DE); Harald Fuchs, Münster (DE); Jasmin Aghassi, Karlsruhe (DE); Gabriel Cadilha Marques, Karlsruhe (DE); Subho Dasgupta, Bangalore (IN); Ben Breitung, Jockgrim (DE); Horst Hahn, Seeheim-Jugendheim (DE)

(73) Assignee: Karlsruher Institut für Technologie, Karlsruhe (DE)

( * ) Notice: Subject to any disclaimer, the term of this patent is extended or adjusted under 35 U.S.C. 154(b) by 333 days.

(21) Appl. No.: 17/250,702

(22) PCT Filed: Aug. 22, 2019

(86) PCT No.: PCT/EP2019/072514
§ 371 (c)(1),
(2) Date: Feb. 22, 2021

(87) PCT Pub. No.: WO2020/039041
PCT Pub. Date: Feb. 27, 2020

(65) Prior Publication Data
US 2021/0358880 A1 Nov. 18, 2021

(30) Foreign Application Priority Data
Aug. 24, 2018 (DE) .......................... 102018214367.6

(51) Int. Cl.
*H01L 23/00* (2006.01)
*G03F 7/00* (2006.01)
(Continued)

(52) U.S. Cl.
CPC ............ *H01L 24/76* (2013.01); *G03F 7/0002* (2013.01); *H01L 21/4853* (2013.01);
(Continued)

(58) Field of Classification Search
CPC ................. H01L 24/76; H01L 21/4853; H01L 23/49866; H01L 2224/24137;
(Continued)

(56) References Cited

U.S. PATENT DOCUMENTS 9,116,145 B2   8/2015   Li et al.
9,930,773 B2   3/2018   Holbery et al.
(Continued)

FOREIGN PATENT DOCUMENTS

CN    108384327 A    8/2018

OTHER PUBLICATIONS

Ladd et al, "3D Printing of Free Standing Liquid Metal Microstructures", Advanced Materials 2013, pp. 5081-5085 (Year: 2013).*
(Continued)

*Primary Examiner* — Selim U Ahmed
*Assistant Examiner* — Evan G Clinton
(74) *Attorney, Agent, or Firm* — Woodard, Emhardt, Henry, Reeves & Wagner, LLP

(57) ABSTRACT

The invention relates to a method (110) for producing an electrically conductive connection (112, 112') on a substrate (114), comprising the following steps:
a) providing a substrate (114), wherein the substrate (114) is configured for receiving an electrically conductive connection (112, 112');
(Continued)

b) providing a reservoir of an electrically conductive liquid alloy, wherein the reservoir has a surface at which the alloy has an insulating layer;

c) providing a capillary (120) configured for taking up the electrically conductive liquid alloy;

d) penetrating of a tip (122) of the capillary (120) under the surface of the reservoir and taking up of a portion of the alloy from the reservoir; and e) applying the portion of the alloy at least partly to the substrate (114) in such a manner that an electrically conductive connection (112, 112') is formed from the alloy on the substrate (114), wherein the alloy remains on the substrate (114) by adhesion.

The invention furthermore relates to a method for producing a microelectronic device (124) and to a microelectronic device (124), in particular a transistor (130).

12 Claims, 3 Drawing Sheets

(51) Int. Cl.
*H01L 21/48* (2006.01)
*H01L 23/498* (2006.01)

(52) U.S. Cl.
CPC ........ *H01L 23/49866* (2013.01); *H01L 24/24* (2013.01); *H01L 24/82* (2013.01); *H01L 2224/24137* (2013.01); *H01L 2224/76152* (2013.01); *H01L 2224/76611* (2013.01); *H01L 2224/82101* (2013.01); *H01L 2224/82102* (2013.01); *H01L 2224/82805* (2013.01)

(58) Field of Classification Search
CPC . H01L 2224/76152; H01L 2224/76611; H01L 2224/82101; H01L 2224/82102; H01L 2224/82805
See application file for complete search history.

(56) References Cited

U.S. PATENT DOCUMENTS

| | | |
|---|---|---|
| 2005/0236566 A1 | 10/2005 | Liu |
| 2009/0082216 A1* | 3/2009 | Cohn .............. B82Y 40/00 73/851 |
| 2011/0267436 A1* | 11/2011 | Yazdanpanah ....... H04N 13/239 977/762 |
| 2019/0280396 A1* | 9/2019 | Lazzi .................. H01L 23/42 |
| 2020/0221580 A1* | 7/2020 | Tavakoli ............. H05K 3/027 |

OTHER PUBLICATIONS

X. Wang, J. Liu, Recent Advancements in Liquid Metal Flexible Printed Electronics: Properties, Technologies, and Applications, Micromachines 2016, 7, DOI 10.3390/mi7120206, Jan. 1, 2006.

C. Ladd, J. H. So, J. Muth and M. D. Dickey, 3D printing of free standing liquid metal microstructures, Adv. Mater. 2013, vol. 25, pp. 5081-5085, Jan. 1, 2013.

N. Lazarus, C. D. Meyer and W. J. Turner, A microfluidic wireless power system, RSC Adv. 2015, vol. 5, pp. 78695-78700, Jan. 1, 2015.

Y. Lin, C. Cooper, M. Wang, J. J. Adams, J. Genzer and M. D. Dickey, Handwritten, Soft Circuit Boards and Antennas Using Liquid Metal Nanoparticles, Small 2015, 11,6397-6403, Jan. 1, 2015.

G. Li, X. Wu and D.- W. Lee, A galinstan-based inkjet printing system for highly stretchable electronics with self-healing capability, Lab Chip 2016, 16, 1366-1373, Jan. 1, 2016.

M.A.H. Khondoker and D. Sameoto, Fabrication methods and applications of microstructured gallium based liquid metal alloys, Smart Mater. Struct. 25, 093001, 2016, Jan. 1, 2016.

F. Bidoky et al., Parasitic Capacitance Effect on Dynamic Performance of Aerosol-Jet-Printed Sub 2 V Poly(3- hexylthiophene) Electrolyte-Gated Transistors, Applied Mater. Interfaces (2016), vol. 8, pp. 27012-27017, Dec. 31, 2016.

M. D. Dickey, Stretchable and Soft Electronics using Liquid Metals, Adv. Mater. 2017, 1606425, 1-19, Jan. 1, 2017.

Intl. App. No. PCT/EP2019/072514 International Preliminary Report on Patentability with English translation, 22 pages, Jan. 9, 2020.

PCT, Intl. App. No. PCT/EP2019/072514 International Search Report with English Translation, 6 pages, dated Jan. 9, 2020.

* cited by examiner

METHOD FOR PRODUCING AN ELECTRICALLY CONDUCTIVE CONNECTION ON A SUBSTRATE, MICROELECTRONIC DEVICE AND METHOD FOR THE PRODUCTION THEREOF

FIELD OF THE INVENTION

The present invention relates to a method for producing an electrically conductive connection on a substrate, to a method for producing a microelectronic device, and to a microelectronic device.

PRIOR ART

Printable electronics require materials which, on the one hand, can be processed in a printing process but which, on the other hand, also have the required electronic properties, particularly with regard to electrical conductivity, mechanical stability or flexibility. Particularly in the context of miniaturization of electronic components, consideration should be given to the fact that materials present in the form of macroscopic volumes behave in part significantly differently than the same materials in the form of microscopic volumes. In electrically conductive connections, which have an ever smaller layer thickness in the context of advancing miniaturization, breaks or complete interruptions of the electrical conduction can occur as a result, an electrical conductivity of the connection thereby being adversely affected.

Liquid metals or alloys, on account of their high metallic conductivity and mechanical flexibility, represent an interesting alternative to solid materials or alloys or to electrically conductive organic substances and have therefore found applications in flexible electronics for some time on a macroscopic scale with dimensions of above 0.1 mm up to 10 mm. An overview thereof may be found in the review articles by X. Wang, J. Liu, *Recent Advancements in Liquid Metal Flexible Printed Electronics: Properties, Technologies, and Applications*, Micromachines 2016, 7, DOI 10.3390/mi7120206; and by M. D. Dickey, *Stretchable and Soft Electronics using Liquid Metals*, Adv. Mater. 2017, 1606425, 1-19.

Several methods for processing the liquid metals or alloys are known at the present time. Y. Lin, C. Cooper, M. Wang, J. J. Adams, J. Genzer and M. D. Dickey, *Handwritten, Soft Circuit Boards and Antennas Using Liquid Metal Nanoparticles*, Small2015, 11,6397-6403, describe applying nanoparticles, formed from the liquid metals or alloys, by hand by using a brush or a pen having a channel.

N. Lazarus, C. D. Meyer and W. J. Turner, *A microfluidic wireless power system*, RSC Adv. 2015, Volume 5, pages 78695-78700, describes pouring the liquid metals or alloys into microfluidic channels that have previously been introduced into a silicone matrix.

C. Ladd, J. H. So, J. Muth and M. D. Dickey, *3D printing of free standing liquid metal microstructures*, Adv. Mater. 2013, Volume 25, pages 5081-5085, describe producing free standing structures composed of liquid metals or alloys by using a syringe which retain their shape on account of a surface tension occurring at the surfaces of such structures.

G. Li, X. Wu and D. -W. Lee, *A galinstan-based inkjet printing system for highly stretchable electronics with self-healing capability*, Lab Chip 2016, 16, 1366-1373, use a modified inkjet printer that can produce drops of a liquid metal or alloys, which can be discharged on a substrate.

However, none of these methods is suitable for producing electrically conductive connections having dimensions of 100 µm or less, preferably of 10 µm or less, in particular of 1 µm or less. The applicants' own preliminary experiments revealed, in particular, that it is possible only with considerable efforts firstly to wet a tip with a liquid alloy and secondly to enable a sufficient and uniform material flow of the liquid alloy onto the substrate whose surface is intended to take up a portion of the liquid alloy.

One possible reason for this might be that in the context of miniaturization of the electrically conductive connections, firstly, an occurrence of a high surface tension of the liquid alloys comprising gallium as a constituent and, secondly, a formation of an oxide layer on the surface of the liquid alloy, independently of one another, can distinctly increase the difficulty of the wettability made up of the substrate and of the tool used for applying the electrically conductive connection. A solution that has already been described in the literature consists in dissolving the oxide layer by using an acid; however, this results in an even greater problem of wettability since, in accordance with the applicant's own preliminary experiments, drops of the liquid alloy simply roll off the oxide layer, which may otherwise act as an adhesion promoter. The oxide layer itself also impedes processing and/or uniform wettability, however, because it can hold the drops of the liquid alloy together like a skin and become stringy during processing, which can disturb clean processing of the liquid alloy. Furthermore, the oxide layer can prevent a uniform flow of the material.

U.S. Pat. No. 9,116,145 B2 discloses a method for producing integrated devices by packaging and hybrid integration. That involves providing a substrate, preferably composed of polydimethylsiloxane (PDMS), which has microelectronic devices and, arranged therebetween, microchannels having a width ≥4 µm and a height ≥2 µm. The microchannels are subsequently filled with a liquid metal, in particular a gallium-based liquid metal, in order to produce electrically conductive connections between the microelectronic devices. A stainless steel tube can be used for filling the microchannels.

The overview article by M. A. H. Khondoker and D. Sameoto, *Fabrication methods and applications of microstructured gallium based liquid metal alloys*, Smart Mater. Struct. 25, 093001, 2016 presents production methods for gallium-based liquid metals that are introduced in elastomers such as PDMS, and challenges with regard to their use. It describes the fact that high-pressure infiltration using injection needles is suitable for producing structures ≥150 nm. Furthermore, it is pointed out that the formation of an oxide layer on the surface of the gallium-based liquid metals increases the wetting, which on the one hand is advantageous in order to keep the structures in position, but on the other hand constitutes a disadvantage in the configuration of circuits.

US 2005/0236566 A1 discloses a probe for atomic force microscopy, said probe comprising a holder and a shank. At one of its ends the shank has an attachment connected to the holder, and at its other the shank has a tip, wherein a capillary channel is situated between the attachment and the tip.

Based hereon, the object of the present invention is to provide a method for producing an electrically conductive connection on a substrate, a method for producing a microelectronic device and a microelectronic device which at least partly overcome the explained disadvantages and restrictions of the prior art.

In particular, the methods and the device are intended to enable a liquid alloy to be taken up in a simple manner and to be applied to a substrate, and also a sufficient and uniform material flow of the liquid alloy onto the substrate.

DISCLOSURE OF THE INVENTION

This object is achieved by using a method for producing an electrically conductive connection on a substrate, a method for producing a microelectronic device and a microelectronic device in accordance with the features of the independent claims. Advantageous developments, which are realizable individually or in any desired combination, are presented in the dependent claims.

Hereinafter, the terms "have", "comprise", "encompass" or "include" or any grammatical deviations therefrom are used in a non-exclusive way. Accordingly, these terms can refer either to situations in which, besides the features introduced by these terms, no further features are present, or to situations in which one or more further features are present. By way of example, the expression "A has B", "A comprises B", "A encompasses B" or "A includes B" can refer either to the situation in which, apart from B, no further element is present in A (i.e. to a situation in which A exclusively consists of B), or to the situation in which, in addition to B, one or more further elements are present in A, for example element C, elements C and D or even further elements.

Furthermore, it is pointed out that the terms "at least one" and "one or more" and grammatical modifications of these terms, if they are used in association with one or more elements or features and are intended to express the fact that the element or feature can be provided singly or multiply, are generally used just once, for example when the feature or element is introduced for the first time. When the feature or element is subsequently mentioned again, the corresponding term "at least one" or "one or more" is generally no longer used, without this restricting the possibility that the feature or element can be provided singly or multiply.

Furthermore, hereinafter, the terms "preferably", "in particular", "for example" or similar terms are used in connection with optional features, without alternative embodiments thereby being restricted. In this regard, features introduced by these terms are optional features and there is no intention for the scope of protection of the claims, and in particular of the independent claims, to be restricted by these features. In this regard, the invention, as will be recognized by the person skilled in the art, can also be carried out using other embodiments. In a similar manner, features introduced by "in one embodiment of the invention" or by "in one exemplary embodiment of the invention" are understood as optional features, without alternative embodiments or the scope of protection of the independent claims being intended to be restricted thereby. Furthermore, these introductory expressions are intended to have no effect on all possibilities of combining the features introduced thereby with other features, whether they be optional or non-optional features.

In a first aspect, the present invention relates to a method for producing an electrically conductive connection on a substrate. The present method comprises steps a) to e) described in specific detail below, wherein steps a) to c) can preferably be carried out in any desired order, in particular also at least partly simultaneously, while step d) can preferably be carried out after steps b) and c) and step e) can preferably be carried out after step d). In this case, in particular, steps d) and e) can be carried out alternately multiply in succession. The individual steps of the present method are:

a) providing a substrate, wherein the substrate is configured for receiving an electrically conductive connection;

b) providing a reservoir of an electrically conductive liquid alloy, wherein the reservoir has a surface at which the alloy has an insulating layer;

c) providing a capillary configured for taking up the electrically conductive liquid alloy; d) penetrating of a tip of the capillary under the surface of the reservoir and taking up of a portion of the alloy from the reservoir; and e) applying the portion of the alloy to the substrate in such a manner that an electrically conductive connection is formed from the alloy on the substrate, wherein the alloy remains on the substrate by adhesion.

Step a) involves providing a substrate configured for receiving an electrically conductive connection. In this case, the term "substrate" denotes a support, comprising a body having a surface, the latter preferably being present in the form of a planar surface. The surface of the substrate can be configured as flat. In a preferred embodiment, at least two microelectronic components can be applied on the surface of the substrate. Preferably, in this case, at least two of the microelectronic components can be spatially separated from one another. Furthermore, however, microelectronic components that have already been electrically conductively connected to one another can also be present on the surface of the substrate. In this case, the "microelectronic component" is an arbitrary miniaturized electronic element configured to influence at least one electromagnetic variable, in particular a voltage or a current, in a predefined manner. Other types of electromagnetic variables, including optical variables, are possible, however. The microelectronic components include in particular electrically conductive electrodes, solid electrolytes, semiconducting components or insulating regions. Other types of microelectronic components are possible, however. As explained in greater detail below, a plurality of microelectronic components can preferably form a microelectronic device.

The term "spatially separated from one another" means that the microelectronic components are arranged on the substrate or on a microelectronic component already situated on the substrate in such a manner that a distance remains between two adjacent microelectronic components. However, in order to establish electronic communication between two adjacent microelectronic components that are spatially separated from one another, said distance can be bridged by using an "electrically conductive connection", which is distinguished by the fact that it enables the electronic communication between the microelectronic components of a microelectronic device that are connected by it, in particular through one-sided or mutual influencing by using an electronic variable, in particular a voltage or a current. As explained in greater detail below, in this case, as customary in microelectronics, the electrically conductive connection can assume in particular a form of a linear electrical conductor, wherein the conductor applied on the substrate can assume a length in the direction of its longest extent, a width perpendicular to the direction of the longest extent, and a height corresponding to its layer thickness, where the width can be exceeded by the length by at least a factor of 5, preferably a factor of 10, particularly preferably by a factor of 20. However, even longer or shorter electrically conductive connections are possible with the present method. The layer thickness can generally be defined by the manner of material application to the substrate.

As explained in greater detail below, in this case, the electrically conductive connection can be embodied from an electrically conductive material, in particular a metallically conductive material having an electrical conductivity of at least $10^4$ S/m, preferably of at least $10^5$ S/m, particularly preferably of at least $10^6$ S/m. However, electrically conductive materials having a lower electrical conductivity of above 1 S/m, in particular electrically conductive polymers, are likewise possible in principle.

In order to limit an influencing of the electromagnetic variables of the microelectronic components to desired ranges, the substrate is configured for receiving an electrically conductive connection such that, on the one hand, it is configured as insulating and therefore has an electrical conductivity with preference of at most $10^{-4}$ S/m, preferably of at most $10^{-6}$ S/m, particularly preferably of at most $10^{-8}$ S/m, and, on the other hand, it has a surface suitable for applying an electrically conductive connection. In the present case, as explained in greater detail below, the electrically conductive connection is produced from an electrically conductive liquid alloy, such that the substrate preferably has a surface which is as flat and planar as possible and which has a wettability sufficient to prevent the liquid alloy from unintentionally flowing from the substrate. For the same reason, surfaces of microelectronic components already situated on the substrate are preferably likewise planar and have a sufficient wettability. In this case, the term "wettability" denotes a ratio of a surface tension of the substrate in relation to the surface tension of the liquid alloy applied thereto.

Step b) involves providing a reservoir of an electrically conductive liquid alloy, wherein the reservoir is preferably applied to a carrier substrate. In this case, the term "electrically conductive liquid alloy" encompasses a material composed of at least two components, at least one component thereof, preferably at least two of the components being a metal, wherein the at least two components form a metallic bond with one another, such that a material formed thereby can also be regarded as a metallically conductive material having an electrical conductivity specified above. In a particularly preferred embodiment, the electrically conductive liquid alloy comprises the chemical element gallium (Ga) and at least one further chemical element selected from Indium (In), tin (Sn), sodium (Na), potassium (K), gold (Au), magnesium (Mg), lead (Pb), nickel (Ni) and mercury (Hg). Alloys of this type typically have a melting point of −20° C. to below +20° C., such that they are in a liquid state of matter at room temperature, for which a temperature of 20° C. to 25° C., in particular 20° C. or 25° C., is usually fixed. In this case, the term "melting point" denotes a temperature at which the material undergoes transition from a solid state of matter to the liquid state of matter.

By way of example, the electrically conductive liquid alloy can comprise Galinstan®. The term "Galinstan" is a trade name denoting a eutectic alloy which, as indicated for clinical thermometers in EP 0 657 023 B1, comprises gallium in a concentration of 65 to 95% by weight, indium in a concentration of 5 to 22% by weight and optionally tin in a concentration of 0 to 11% by weight. In this case, the term eutectic alloy refers to the fact that this alloy is in a phase equilibrium that is distinguished by the fact that ambient conditions can be chosen freely only with a very small range. However, other types of electrically conductive alloys are likewise usable as long as they are liquid at room temperature.

As already mentioned, a reservoir of the electrically conductive liquid alloy is provided during step b). In this case, the term "reservoir" denotes a selected volume of the alloy, which can be taken in particular from a larger volume that is preferably situated in a supply container. By way of example, the reservoir can be formed from one or a plurality of coherent drops of the liquid alloy. In the present case, it is particularly preferred if the reservoir can be applied to a carrier substrate, wherein the term "carrier substrate" denotes a support whose surface is chosen such that it is configured for receiving the selected volume of the alloy, without a portion of the liquid alloy being able to flow over an edge of the support. This can be achieved in particular by using a suitable choice of a size and a wettability of the carrier substrate. With regard to the term "wettability", reference is made to the explanation above.

In the present case, a situation where a portion of the liquid alloy flows over an edge of the support is additionally prevented by virtue of the fact that the liquid alloy used behaves in such a manner that the reservoir provided therefrom has a surface at which the alloy forms an insulating layer. In this case, the term "surface of the reservoir" denotes a surface which is formed on a side of the reservoir facing away from the surface of the carrier substrate and which is exposed to surroundings, in particular an atmosphere, for example composed of ambient air or an artificial atmosphere in a protection area. Without restricting the generality, the insulating layer can form as a result of an interaction between the surface of the reservoir and the surroundings. In this case, the term "insulating layer" means that the reservoir still has the electrically conductive liquid alloy within it, while a thin film forms on the surface of the reservoir, which thin film can insulate the inside of the reservoir from the surroundings. In this case, the insulating layer can firstly represent a barrier visa vis the surroundings, which barrier can largely, preferably completely, prevent a further interaction between the electrically conductive liquid alloy situated within the reservoir and the surroundings.

Furthermore, the insulating layer situated at the surface of the reservoir can be configured as electrically insulating and therefore have a very low electrical conductivity specified above. By way of example, an oxide layer can form on the surface of the reservoir of the liquid alloy comprising the chemical element gallium (Ga) and at least one further chemical element selected from Indium (In), tin (Sn), sodium (Na), potassium (K), gold (Au), magnesium (Mg), lead (Pb), nickel (Ni) and mercury (Hg), in particular Galinstan®, which oxide layer firstly represents an insulating barrier visa vis the surroundings, as described above, and secondly is configured as electrically insulating. Finally, the insulating layer formed at the surface of the reservoir can assume a solid state of matter and thereby increase the surface tension such that the reservoir is held together in such a manner that deliquescence of liquid alloy comprised by the reservoir can be prevented.

Step c) involves providing a capillary configured for taking up the electrically conductive liquid alloy. In this case, the term "capillary" denotes an elongated body having two ends, wherein the body has a cavity extending along a length of the body. In the present case, the capillary can have in particular a length of 5 cm to 20 cm, preferably of 8 cm to 12 cm. The body thus has an outside and an inside, wherein the "outside" denotes a part of the surface of the body in relation to surroundings and the "inside" denotes a further part of the surface of the body in relation to the cavity. In a particularly preferred embodiment, the body of the capillary has an external diameter of 0.1 mm to 2 mm, preferably of 0.5 mm to 1.5 mm, and an internal diameter of 100 nm to 1.5 mm, preferably of 0.1 mm to 1.0 mm, wherein the external diameter exceeds the internal diameter. Other values for the external diameter and/or the internal diameter are possible, however, as long as the external diameter is greater than the internal diameter. In particular by virtue of the fact that the capillary has the cavity, it is configured for taking up the electrically conductive liquid alloy in that, as described in greater detail under step d), a portion of the liquid alloy can pass from the reservoir into the cavity.

In the present case, the capillary provided in accordance with step c) has a tip. In this case, the term "tip" denotes a taper of an end of the capillary, wherein in particular the external diameter can be reduced by up to at least 25%, preferably by up to at least 50%, particularly preferably by up to at least 75%, in the region of the tip. Thus, as described in greater detail under step d), in a simpler manner, the capillary can penetrate into the reservoir with the liquid alloy and, as described in greater detail under step e), in a simpler manner, the capillary can dispense a portion of the liquid alloy taken up by the cavity onto a spatially more restricted region of the surface of the substrate provided during step a).

Herein, the tip can be produced by using a corresponding taper of the selected end of the capillary. In an alternative embodiment, the tip can be fitted to the selected end of the capillary, wherein the end can be unchanged or can already have a taper. In a particular embodiment, a hollow tip suitable for an atomic force microscope (AFM) can be used as the tip.

The invention proposes configuring the capillary in such a manner that at least the inside of the capillary has a metallic surface. In this case, the term "metallic surface" denotes a surface of a body which has metallic properties, in particular a metallic conductivity with an electrical conductivity as described in greater detail above. For this purpose, the capillary can completely comprise a metallically conductive material, likewise described above, preferably gold (Au). In the particular embodiment mentioned above, the hollow tip suitable for an atomic force microscopic can be coated with the metallically conductive material, preferably gold (Au).

In an alternative and particularly preferred embodiment, however, the body of the capillary can comprise a nonmetallic material, wherein at least the inside of the body composed of the nonmetallic material can be covered with a metallic layer. In this case, the term "nonmetallic material" denotes a material which does not have a metallic conductivity, but rather is preferably configured as electrically insulating and therefore has an extremely low electrical conductivity, as specified above, wherein the selected material can be brought to the desired geometric shape of a capillary having a tapering tip at one end. In a preferred embodiment, in particular a material selected from glass, quartz, an organic polymer or silicon nitride can be used for this purpose. Other metallic and nonmetallic materials are possible, however. Furthermore, the outside of the body composed of the nonmetallic material can also be covered with a metallic layer. This can enable a simpler coating of the body with the metallic layer and furthermore afford further advantages explained below.

Herein, the "metallic layer" applied on the inside and optionally on the outside of the body denotes a coating that is as homogeneous as possible on the relevant surface of the body of the capillary, wherein the metallic layer can have with preference a layer thickness of 5 nm to 50 nm, preferably of 10 nm to 25 nm. As material for the metallic layer, a multiplicity of metals whose use for this purpose is known are suitable in principle, preferably gold, silver, platinum, aluminum, gallium, indium, tin, alloys or oxides thereof.

In a particular embodiment of the present method, in this case, the metallic layer can be applied to the relevant surface of the body of the capillary by using radio-frequency sputtering, In this case, the "radio-frequency sputtering" comprises a coating method in which atoms are ejected from a solid referred to as "target" by bombardment with high-energy ions, in particular with noble gas ions and form a plasma before they deposit on the desired surface, wherein a radio-frequency alternating field is applied between the target and the body to be coated. However, other types of coating methods are likewise possible, in particular thermal methods (physical vapor deposition, PVD methods), in which the coating material is heated and vapor-deposited, chemical coating methods using precursors (chemical vapor deposition, CVD methods) and electrochemical methods, in particular electroplating.

Step d) involves penetrating of the tip of the capillary under the surface of the reservoir and taking up of a portion of the alloy from the reservoir. In this case, the term "penetrating" means that the tip of the capillary, in particular on account of the taper relative to the rest of the capillary, can penetrate into the reservoir in such a manner that firstly it penetrates through the solid surface of the reservoir before it can penetrate or dip into the volume situated under the insulating layer, said volume comprising the electrically conductive liquid alloy, in order to take up a portion thereof. In this case, the term "taking up" denotes removing a defined portion of the electrically conductive liquid alloy from the volume containing the liquid. As was able to be established in corresponding experiments, in particular the capillary having a metallic surface on its inside exhibits a high wettability that enables sufficient and rapid taking up of a defined portion of the electrically conductive liquid alloy from the reservoir.

Step e) involves completely or partly applying the portion of the alloy taken up by the capillary to a surface of the above-described substrate in such a manner that the alloy placed on the substrate by using the capillary forms an electrically conductive connection on the surface of the substrate. The term "applying" here relates to the portion of the liquid alloy taken up by the cavity of the capillary being discharged sufficiently and as uniformly as possible onto the surface of the substrate. In this case, with preference an angle with respect to the substrate surface of at most 45°, preferably of 30°, particularly preferably of 20°, can be formed. However, other angles are likewise possible in principle.

Applying the portion of the alloy in accordance with step e) is preferably effected at room temperature as explained in greater detail above, and at room humidity, wherein the term "room humidity" denotes an air humidity of 0% relative air humidity to 75% relative air humidity, preferably of 25% relative air humidity to 50% relative air humidity. In a particularly preferred embodiment, applying the portion of the alloy in accordance with step e) can be effected under a protective atmosphere, in particular under nitrogen or argon. As a result, the present method can advantageously be used for sensitive materials as well. As was able to be stablished in corresponding experiments, in particular the capillary having a metallic surface on its inside exhibits a high wettability that enables a sufficient and uniform material flow when the liquid alloy is dispensed onto the surface of the substrate.

In the present method, the alloy remains on a selected region of the surface of the substrate by adhesion. The combination of the terms "adhesion" and "remaining on the substrate" thus describes a sequence of applying the liquid alloy to the surface of the substrate by which the liquid alloy analogously to the above-described behavior when the liquid alloy is applied to a carrier substrate in accordance with step b) in order to form a reservoir. As a result, too, of applying the liquid alloy to the surface of the substrate, it is possible, without restricting the generality, on account of the interaction between the surface of the electrically conductive connection and the surroundings, for an insulating layer in the form of a film, in particular an oxide layer, to form on the surface of the electrically conductive connection. Here, too, the insulating layer can constitute a barrier visa vis the surroundings, can be configured as electrically insulating and therefore have a very low electrical conductivity specified above, and can assume a solid state of matter in order thus to hold the electrically conductive connection together, in order to prevent deliquescence of the liquid alloy contained therein.

In this manner, it is possible to achieve a good contacting by providing electrically conductive connections that the latter provide a highly conductive material which automatically forms a parasitic capacitance with adjacent conductor structures. The self-insulation brought about by the proposed alloy comprising with preference gallium, indium and preferably tin can thus be utilized advantageously for these purposes.

The present method is not concerned with breaking through the oxide layer formed on the liquid metal alloy, rather the capillary configured for taking up the electrically conductive liquid alloy actually makes it possible in the first place to print the liquid alloy at least partly onto the substrate, despite the oxide layer that forms on the surface of the liquid alloy. The oxide layer thus remains in the electrically conductive connections, and so connections to one or more microelectronic components in a microelectronic device are produced as a result, these having particularly low capacitances as a result of the existing oxide layer. In contrast to the prior art, according to which substances (inks) for printing methods usually contain additives that hamper or prevent a good contact or require subsequent processing steps in order to sinter, separate or evaporate the applied substances, the present method can dispense with such processing steps because the printed structure functions immediately, since an ohmic contact between the printed liquid metal alloy and metallic structures on the substrate can form straight away.

In this manner, it is possible to produce reliably electrically conductive connections with a resolution that can be higher than in the methods known from the prior art as described in the introduction. In particular, the present method makes it possible to produce electrically conductive connections having dimensions of 100 µm or less, preferably of 10 µm or less, in particular of 1 µm or less. In this case, the term "dimension" relates to a structure size, in particular to the above-described width of the electrically conductive connection that is producible by using the present method. In particular a writing speed at which the liquid alloy is applied to the substrate can be of importance here. In this case, the above-described length of the electrically conductive connections can be defined in particular by a time duration for applying the liquid alloy to the surface of the substrate and the volume of the portion of the alloy taken up by the capillary. The layer thickness of the electrically conductive connections can generally be defined by the internal diameter of the capillary and the writing speed. Preferred values for the writing speed can be from 1 µm/s to 100 µm/s; other values are possible, however.

The insulating layer that forms upon contact with the surroundings, in particular the oxide layer, on the electrically conductive connections produced by using the present method can advantageously passivate and insulate the surfaces of the electrically conductive connections, such that parasitic capacitances on the microelectronic devices provided therewith can be reduced. The parasitic capacitances that occur in the case of contacting with electrically conductive materials are presented as an unavoidable technical problem e.g. in F. Zare Bidoky and C. D. Frisbie, *Parasitic Capacitance Effect on Dynamic Performance of Aerosol-Jet-Printed Sub 2 V Poly(3-hexylthiophene) Electrolyte-Gated Transistors*, ACS Appl. Mater. Interfaces 2016, 8, 27012. By contrast, the method proposed here makes it possible to effect electrically highly conductive contacting and at the same time to achieve a reduction of parasitic capacitances. For the case where a location of an electrically conductive connection is intended to be electrically conductively contacted, it is furthermore possible, during step e) or after that, by exerting pressure on the relevant location, to break open the insulating layer at the relevant location in order thus to produce an electrically conductive contact. As a result, it is possible to produce in particular branching junctions or crossing junctions from the linear electrically conductive connections.

In particular in contrast to the method disclosed in U.S. Pat. No. 9,116,145 B2, the method present here involves a printing process. While microfluidic channels are required in U.S. Pat. No. 9,116,145 B2 so as to be filled with a liquid metal alloy by using microfluidics in order that the microfluidic channels thus filled are subsequently used as electrically conductive connections on an embedded CMOS chip, the present method makes it possible to print the liquid metal alloy by using a freely movable capillary in order to guide the liquid metal alloy over the surface to be contacted and, in this manner, to write the liquid metal alloy directly onto the substrate. While U.S. Pat. No. 9,116,145 B2 involves predefining possible patterns of the electrically conductive connections by using the microchannels introduced onto the substrate, in the present method the capillary can be moved freely in order to produced desired patterns. The present method thus concerns a local, printable contacting method for individual microelectronic components in a microelectronic device, rather than a wiring method for already completed microelectronic devices in accordance with U.S. Pat. No. 9,116,145 B2.

In a particularly preferred embodiment, applying the portion of the alloy to the substrate in accordance with step e) can be effected by using scanning probe lithography, wherein the capillary is used as a probe for the scanning probe lithography. In this case, the term "scanning probe lithography" denotes a method which can circumvent the optical resolution limit and which makes it possible to produce structures having dimensions of 100 µm or less, preferably of 10 µm or less, in particular of 1 µm or less. This involves using a probe configured to take up a material that is intended to be applied to a substrate, and subsequently to deposit it at a defined location on the substrate. This process can also be referred to as a "printing process". A wide range of materials can be processed using known probes for scanning probe lithography. For this purpose, it is proposed to use the capillary provided in accordance with step c) as a probe in method for scanning probe lithography. In an alternative embodiment, however, it is also possible to use other probes, in particular tips of an atomic force microscope that are often used in scanning probe lithography. The proposed use of a preferably coated capillary as a probe in a method for scanning probe lithography solves considerable problems which occur during the deposition of liquid metals and which are known from the prior art, in particular with regard to miniaturization when writing the liquid metal.

Other methods for applying a portion of the alloy on the substrate in order to produce an electrically conductive connection from the alloy are likewise possible, however, in particular a use of an inkjet printer, in particular for producing structures having dimensions starting from 50 μm, mask-based methods using a resist in order to allow the liquid alloy to adhere only to defined locations on the substrate, or microcontact printing methods that use a stamp to transfer the material to the surface.

In a further aspect, the present invention relates to a method for producing a microelectronic device. This method comprises the above-described steps a) to e) of the method for producing an electrically conductive connection on a substrate, wherein, however, at least two microelectronic components, of which preferably at least two can be spatially separated from one another, are applied on the substrate provided in accordance with step a), and wherein applying the portion of the alloy to the substrate in accordance with step e) is effected in such a manner that an electrically conductive connection is formed between two of the microelectronic components, in particular between two of the microelectronic components that are spatially separated from one another, on the substrate. In this manner, even microelectronic components that are spatially separated from one another on a substrate can be electrically conductively connected to one another in order to form a microelectronic device in this manner.

For further details with regard to the present method for producing a microelectronic device, reference is made to the description of the microelectronic device and of the method for producing an electrically conductive connection on a substrate.

In a further aspect, the present invention relates to a microelectronic device, which is preferably producible by the method for producing a microelectronic device as described herein. In this case, the microelectronic device comprises:
 a substrate;
 at least two microelectronic components; and
 at least one electrically conductive connection between
  the at least two microelectronic components,
wherein the electrically conductive connection is an alloy comprising gallium and at least one further chemical element selected from Indium (In), tin (Sn), sodium (Na), potassium (K), gold (Au), magnesium (Mg), lead (Pb), nickel (Ni) and mercury (Hg), and wherein the electrically conductive connection has a width of at most 100 μm, preferably of at most 10 μm, in particular of at most 1 μm. A width of at least 100 nm, preferably of at least 50 nm, can be specified as a minimum value. Here, too, the preferably at least two of the microelectronic components can be spatially separated from one another, the electrically conductive connection preferably being arranged between these microelectronic components that are spatially separated from one another.

The "microelectronic device" denotes an electronic circuit in the form of discrete or integrated circuits or a combination thereof. This includes in particular transistors, memory cells, logic gates and devices comprising at least one of the microelectronic components.

Electrically conductive materials known from the prior art for producing electrically conductive connections, in particular gold (Au) or silver (Ag), are often not suitable for use with certain materials such as are used in microelectronic devices. Firstly, the aforementioned electrically conductive materials gold or silver are comparatively expensive. Secondly, electrically conductive materials of this type can chemically attack and therefore at least partly destroy certain devices, for example so-called "electrolyte-gated" transistors, as disclosed in particular in EP 2 811 525 A1. These disadvantages can be overcome by use of the electrically conductive materials proposed here. This can result in distinctly improved electrical properties of the devices used, since factors that have caused limitations hitherto are rendered inapplicable, for example a contact between a conductive electrode and a solid electrolyte of a field effect transistor (FET). While large capacitances normally form here in accordance with the prior art, they can be rendered inapplicable owing to the insulating oxide layer of the electrically conductive connections according to the invention.

In contrast to the microelectronic devices disclosed in U.S. Pat. No. 9,116,145 B2, which are connected to one another and toward the outside by using microchannels filled with a liquid metal alloy, the present microelectronic devices have electrically conductive connections composed of liquid metal alloy which are applied at least partly on the surface of the substrate and which connect individual microelectronic components within the microelectronic device to one another. Therefore, a transistor which is disclosed by way of example in U.S. Pat. No. 9,116,145 B2 and which is wired internally in a conventional manner also differs from a transistor in accordance with the present connection, which internally at least one electrically conductive connection between individual microelectronic components, in particular between source and drain, of the transistor, which connection was produced in accordance with the present method.

For further details with regard to the present microelectronic device, reference is made to the description of the method for producing an electrically conductive connection on a substrate.

BRIEF DESCRIPTION OF THE FIGURES

Further details and features of the present invention are evident from the following description of preferred exemplary embodiments, particularly in conjunction with the dependent claims. In this case, the respective features can be realized by themselves or as a plurality in combination with one another. However, the invention is not restricted to the exemplary embodiments. The exemplary embodiments are illustrated schematically in the following figures. In this case, identical reference numerals in the figures designate identical or functionally identical elements or elements that correspond to one another with regard to their functions.

Specifically in the Figures.

DESCRIPTION OF THE EXEMPLARY EMBODIMENTS

Figure 1:
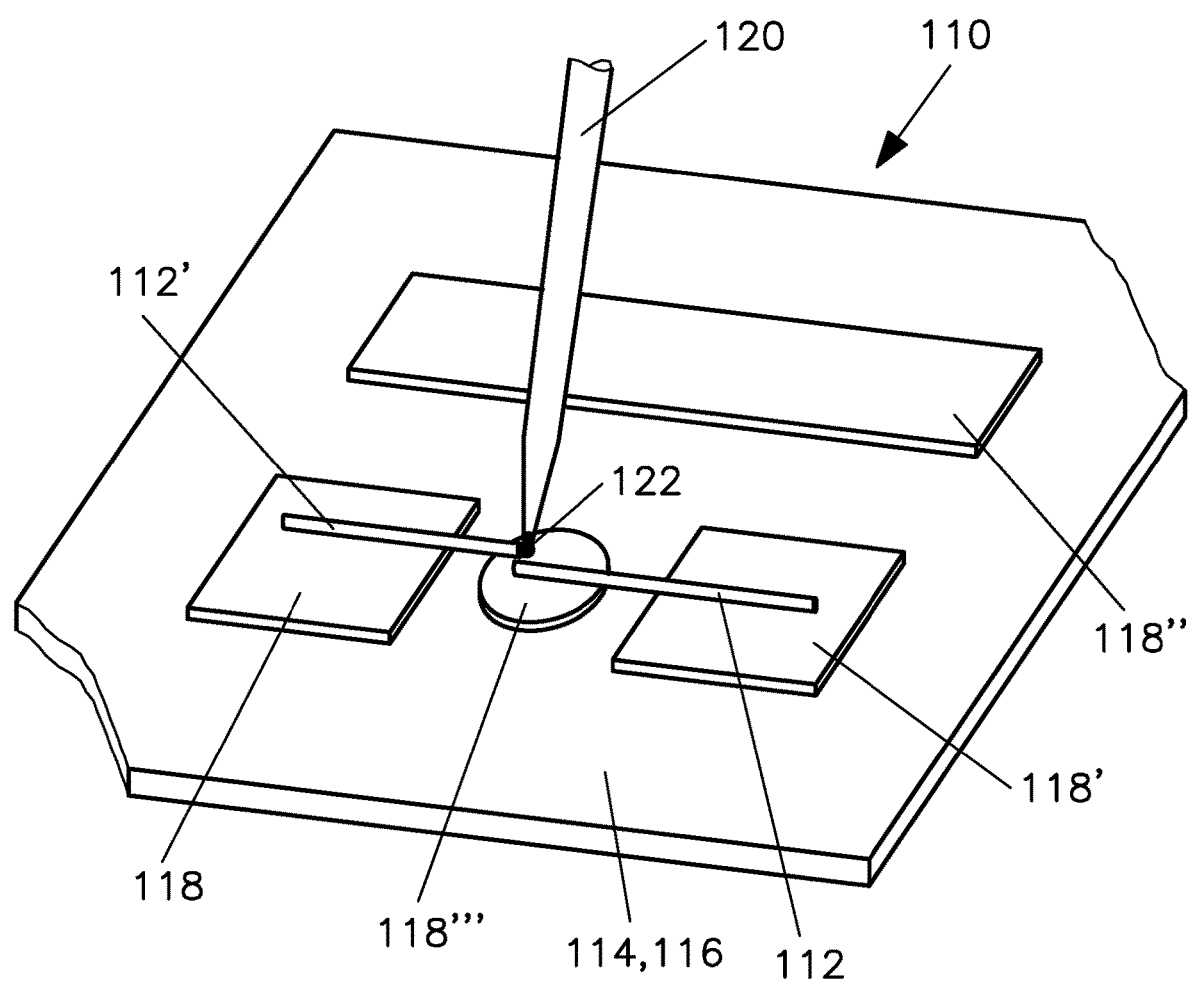
FIG. 1 shows a schematic illustration of one preferred embodiment of the method according to the invention for producing an electrically conductive connection on a substrate.

FIG. 1 shows a schematic illustration of one preferred embodiment of step e) of the method 110 according to the invention for producing an electrically conductive connection 112, 112' on a substrate 114. While the electrically conductive connection 112 has already been completed, FIG. 1 shows the production of the electrically conductive connection 112' on the substrate 114. The substrate 114 illustrated schematically in FIG. 1, which substrate was provided in accordance with step a), has a planar support 116, on which four microelectronic components 118, 118', 118", 118'" are applied, which are spatially separated from one another. However, other types of substrates 114 are likewise possible.

Herein, FIG. 1 shows how, in accordance with step e), by using a capillary 120 having a tip 122, a portion of an alloy is applied to the substrate 114 in such a manner that the electrically conductive connection 112' forms from the alloy on the substrate 114 by manner of the alloy remaining on the substrate 114 by adhesion. As illustrated in FIG. 1, applying the portion of the alloy to the substrate 114 in accordance with step e) of the present method 110 is effected in such a manner that the desired electrically conductive connection 112' is formed between the two of the microelectronic components 118, 118'" that are spatially separated from one another on the substrate 114. By contrast, the already completed electrically conductive connection 112, connects the two of the microelectronic components 118, 118'" that are spatially separated from one another on the substrate 114. It is possible to apply further electrically conductive connections on the substrate 114.

The capillary 120 illustrated in the figure, which was provided in accordance with step c) of the present method 110, is an internally hollow small tube composed of quartz glass which has an external diameter of 1 mm and a cavity having an internal diameter of 0.5 mm, and which was obtained by drawing from a glass capillary. After that, the capillary 120 was covered with a metallic layer (not illustrated) of sputtered gold (Au), wherein the layer has a layer thickness of 10 nm to 20 nm. However, other types of capillaries or metallic coatings of the capillary 120 are possible. In this respect, reference is made to the above description, in particular.

In accordance with step b) of the present method 110, a reservoir of an electrically conductive liquid alloy was previously provided, wherein the reservoir has a surface at which the alloy has an insulating layer. In order to produce the electrically conductive connection 112, 112' illustrated schematically in FIG. 1 on the substrate 114, use was made of an electrically conductive liquid alloy composed of Galinstan®, which denotes a eutectic alloy comprising gallium in a concentration of 65 to 95% by weight, indium in a concentration of 5 to 22% by weight and optionally tin in a concentration of 0 to 11% by weight. A melting point of −20° C. to below +20° C. is typical for such alloys, such that they are liquid at room temperature, i.e. at a temperature of 20° C. to 25° C., in particular at 20° C. or 25° C. Other types of electrically conductive alloys are likewise usable, however, as long as they are in a liquid state of matter at room temperature. In this respect, reference is likewise made to the above description.

Step d) of the present method 110 involved penetration of the tip 122 of the capillary 120 under a surface of the reservoir, said surface having an insulating layer, in particular an oxide layer, and subsequent taking up of a portion of the alloy from the reservoir into the cavity of the capillary 120. The tip 122 of the capillary 120 ensures, firstly, that the insulating layer on the surface of the reservoir cannot be pierced particularly easily and, secondly, that the liquid alloy can be applied from the cavity of the capillary 120 onto a spatially more restricted region of the surface of the substrate 114. As was able to be established in corresponding experiments, in particular the capillary 120 having on its inside the metallic layer of the sputtered gold exhibits a high wettability that ensures a sufficient and uniform material flow when the liquid alloy is dispensed onto the surface of the substrate 114. However, a use of other metallic materials that bring about a high wettability is likewise possible.

After the portion of the alloy had been taken up from the reservoir into the cavity of the capillary 120, as illustrated in FIG. 1, in accordance with step e), the portion of the alloy present in the cavity of the capillary 120 is applied to the substrate 114 wholly or partly by using the capillary 120 through the tip 122 such that firstly the electrically conductive connection 112 and then the further electrically conductive connection 112' were produced on the substrate 114, the alloy in each case remaining on the substrate 114 by adhesion. As a result of contact with the surroundings, an insulating layer, in particular an oxide layer, forms in each case on the surface of the electrically conductive connections 112, 112' facing the surroundings, said layers advantageously being suitable in particular for passivating and insulating the surfaces of the electrically conductive connections 112, 112', such that parasitic capacitances in the electrically conductive connections 112, 112' can be distinctly reduced.

Figure 2:
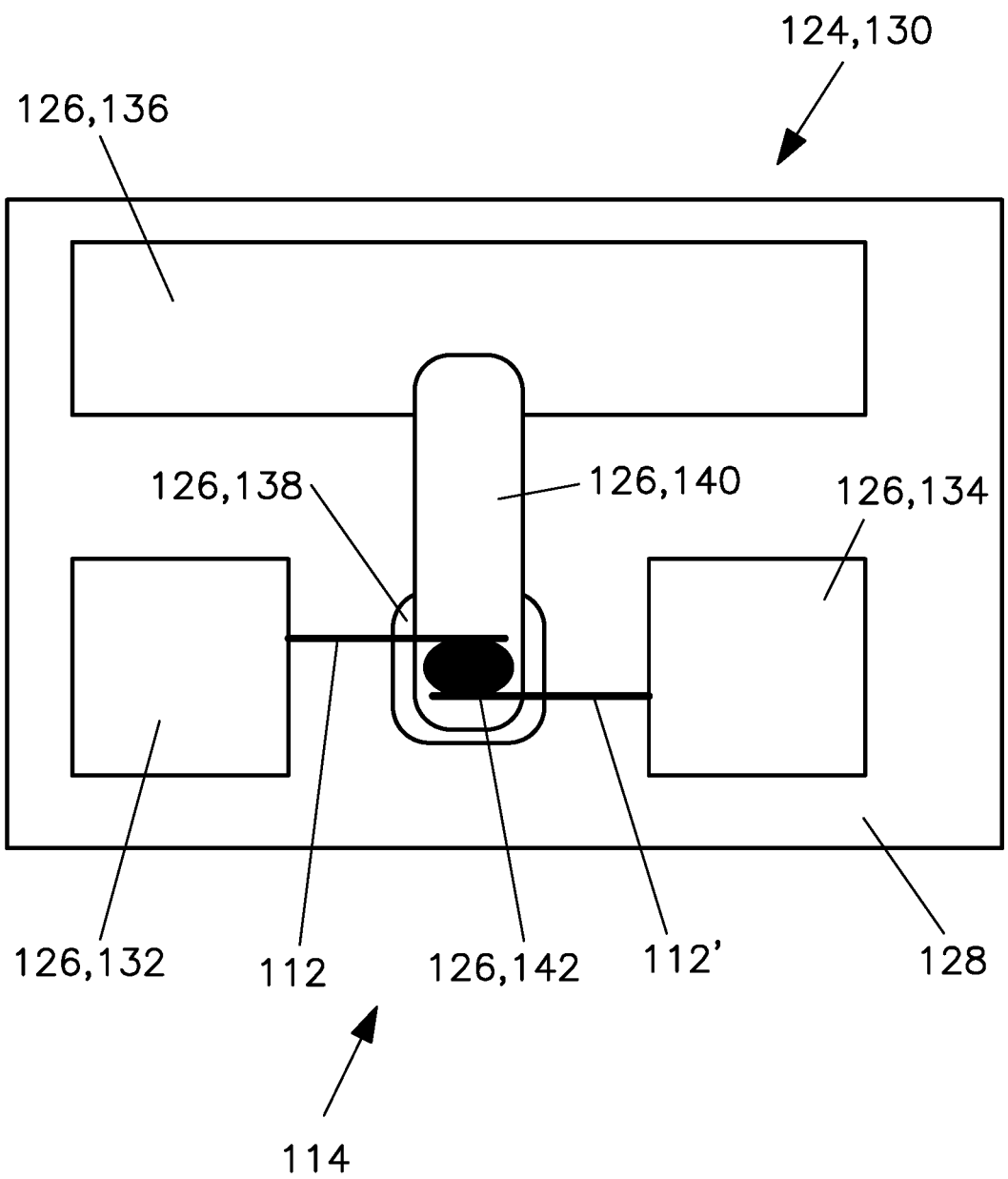
FIG. 2 shows an illustration of a novel transistor produced by the method according to the invention for producing an electrically conductive connection on a substrate.

The microelectronic device 124 illustrated schematically in FIG. 2 can also be produced in this manner, said microelectronic device comprising a plurality of microelectronic components 126 fitted on the planar support 128, wherein the microelectronic components 126 and the planar support 128 here together form the substrate 114. The microelectronic device 124 shown here is a transistor 130, in particular a field effect transistor (FET), which has a source electrode 132, a drain electrode 134, a gate electrode 136, a solid electrolyte 138, a semiconducting layer 140 and an insulating region 142. In this exemplary embodiment, the electrodes 132, 134, 136 comprise a highly conductive transparent metal oxide, in particular indium tin oxide (ITO). However, other electrode materials, including aluminum-doped zinc oxide (AZO), fluorine-doped tin oxide ($SnO_2$:F; FTO), magnesium oxide (MgO), graphene or electrically highly conductive polymers can likewise be used. In the present exemplary embodiment, the semiconducting layer 140, which partly covers the solid electrolyte 138 and connects the electrolyte 140 to the gate electrode 136, comprises a dispersion of poly(3,4-ethylene dioxythiophene) and polystyrenesulfonic acid (PEDOT:PSS); however, a use of some other organic or inorganic semiconductor is likewise possible.

The insulating region 142 illustrated in FIG. 2 is made of indium oxide and is situated between the two electrically conductive connections 112, 112' produced in accordance with the present method 110, wherein the electrically conductive connection 112 is arranged between the source electrode 132 and the semiconducting layer 140, while the further electrically conductive connection 112' is embodied between the drain electrode 134 and the semiconducting layer 140. As a result of an electrical voltage being applied to the gate electrode 136, a transistor channel of the transistor 130 forms, which transistor channel in this exemplary embodiment has a length corresponding to the distance between the source electrode 132 and the drain electrode 134. A width of the transistor 130 can be defined perpendicular thereto, along the electrically conductive connections and overlap thereof. The transistor 130 illustrated in FIG. 2 is an n-type accumulation-mode transistor. Upon the application of a positive electrical voltage or a negative electrical voltage, both being possible, of −800 mV to +800 mV, the threshold voltage of the transistor 130 can be reached and the transistor 130 becomes electrically conducting.

The transistor 130 illustrated schematically in FIG. 2 has distinctly improved electrical properties. In this regard, a lack of contact between the electrically conductive electrodes 132, 134, 136 and the solid electrolyte 138 is particularly advantageous. Moreover, parasitic capacitances are distinctly reduced in the transistor 130 illustrated schematically in FIG. 2, in particular on account of the insulating oxide layer of the electrically conductive connections 112, 112' according to the invention.

Figure 3A:
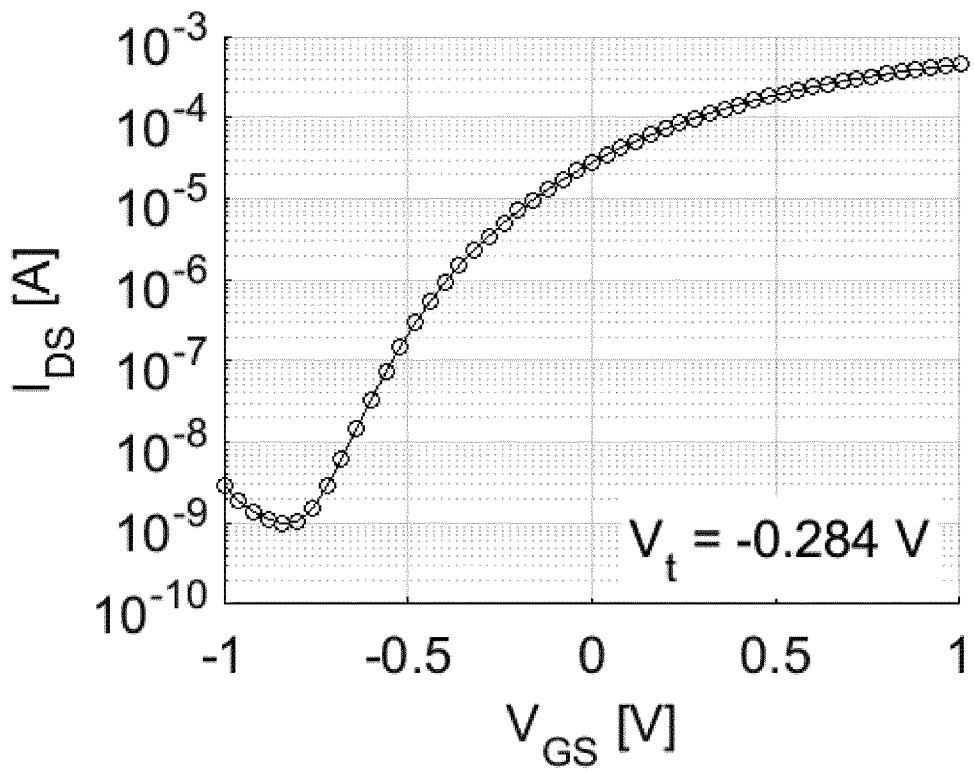
FIGS. 3a and 3b show an illustration of measurement diagrams of a transistor according to FIG. 2.
Figure 3B:
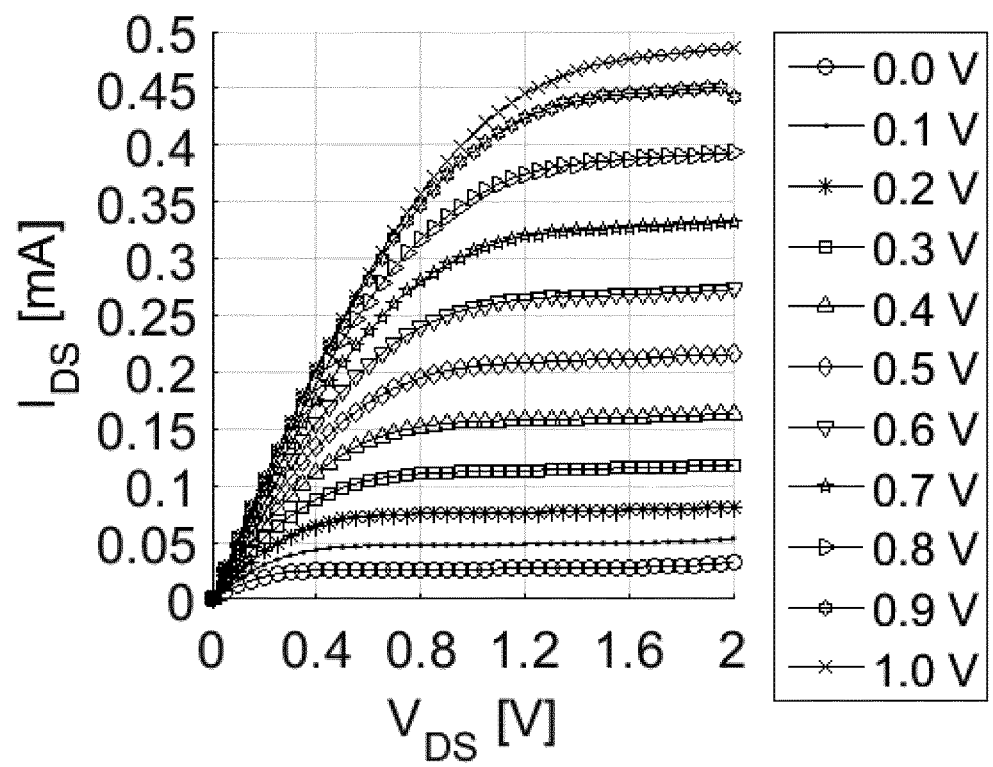

FIGS. 3a and 3b show in each case measurement diagrams illustrated with the novel transistor 130 illustrated schematically in FIG. 2. The illustrations here show in each case a current IDS in A and respectively mA between the drain electrode 134 and the source electrode 132 as a function of the voltage between the gate electrode 136 and the source electrode 132 (FIG. 3a) and respectively between the drain electrode 134 and the source electrode 132 (FIG. 3b).

FIG. 3a shows a transfer characteristic curve of a typical field effect transistor, which operates at a negative threshold voltage in this illustration. If the applied voltage between the gate electrode 136 and the source electrode 132 exceeds a value of approximately −284 mV, the transistor 130 becomes conducting and reaches currents of approximately 1 mA in the saturation region.

FIG. 3b shows the family of output characteristic curves for various electrical voltages between the gate electrode 136 and the source electrode 132 of 0 V to 1 V. The higher the gate voltage, the higher the saturation current to be attained. The exemplary embodiment illustrated here shows a saturation current of approximately 0.5 mA when an electrical voltage of 2 V is applied between the drain electrode 134 and the source electrode 132. In the linear region, i.e. at a lower electrical voltage between the drain electrode 134 and the source electrode 132, it is possible to determine a typical linearly rising current with rising electrical voltage between the drain electrode 134 and the source electrode 132, said current indicating a good ohmic contacting of the drain electrode 134 and the source electrode 132.

LIST OF REFERENCE SIGNS 110 method for producing an electrically conductive connection on a substrate
112 electrically conductive connection
114 substrate
116 planar support
118 microelectronic component
120 capillary
122 tip
124 microelectronic device
126 microelectronic components
128 planar support
130 transistor
132 source electrode
134 drain electrode
136 gate electrode
138 solid electrolyte
140 semiconducting layer
142 insulating region

The invention claimed is:

1. A method for producing an electrically conductive connection on a substrate, comprising the following steps:
    a) providing a substrate, wherein the substrate is configured for receiving an electrically conductive connection;
    b) providing a reservoir of an electrically conductive liquid alloy, wherein the reservoir has a surface at which the alloy has an insulating layer;
    c) providing a capillary configured for taking up the electrically conductive liquid alloy;
    d) penetrating of a tip the capillary under the surface of the reservoir and taking up of a portion of the alloy from the reservoir; and
    e) applying the portion of the alloy at least partly to the substrate in such a manner that an electrically conductive connection is formed from the alloy on the substrate,
    wherein the alloy remains on the substrate by adhesion.

2. The method of claim 1, wherein the alloy provided in accordance with step c) comprises gallium and at least one further chemical element, selected from indium (In), tin (Sn), sodium (Na), potassium (K), gold (Au), magnesium (Mg), lead (Pb), nickel (Ni) and mercury (Hg).

3. The method of claim 1, wherein the capillary has a body having an inside, wherein the inside has a metallic surface.

4. The method of claim 3, wherein the body of the capillary comprises a nonmetallic material, wherein the body of the capillary is covered with a metallic layer.

5. The method of claim 4, wherein gold is used for the metallic layer.

6. The method of claim 4, wherein a layer thickness of 5 nm to 50 nm is adjusted for the metallic layer.

7. The method of claim 4, wherein the metallic layer is applied to the inside of the body of the capillary using radio-frequency sputtering, a thermal method or a chemical coating method.

8. The method of claim 1, wherein the tip of the capillary comprises a taper of an end of the capillary, wherein an external diameter is reduced by up to at least 25% in the region of the tip.

9. The method of claim 1, wherein the applying of the portion of the alloy at least partly to the substrate is effected in such a manner that the capillary forms an angle with respect to the surface of the substrate of at most 45°.

10. The method of claim 1, wherein the applying of the portion of the alloy to the substrate in accordance with step e) is effected using a scanning probe lithography, wherein the capillary is used as a probe for the scanning probe lithography.

11. A method for producing a microelectronic device, comprising steps a) to e) of the method claim 1, wherein the substrate provided in accordance with step a) comprises at least two microelectronic components and applying the portion of the alloy to the substrate in accordance with step e) is effected in such a manner that an electrically conductive connection is formed between at least two of the microelectronic components on the substrate.

12. A method for producing an electrically conductive connection on a substrate, comprising the following steps:

a) providing a substrate, wherein the substrate is configured for receiving an electrically conductive connection;
b) providing a reservoir of an electrically conductive liquid alloy, wherein the reservoir has a surface at which the alloy has an insulating layer;
c) providing a capillary configured for taking up the electrically conductive liquid alloy, wherein the capillary assumes an external diameter of 0.1 mm to 2 mm and an internal diameter of 100 nm to 1.5 mm, wherein the external diameter exceeds the internal diameter,
d) penetrating of a tip the capillary under the surface of the reservoir and taking up of a portion of the alloy from the reservoir; and
e) applying the portion of the alloy at least partly to the substrate in such a manner that an electrically conductive connection is formed from the alloy on the substrate,
wherein the alloy remains on the substrate by adhesion.

* * * * *